(12) United States Patent
Kishibata et al.

(10) Patent No.: US 7,295,016 B2
(45) Date of Patent: Nov. 13, 2007

(54) ELECTRIC LEAKAGE DETECTION SYSTEM

(75) Inventors: Kazuyoshi Kishibata, Numazu (JP);
Masahiko Endou, Numazu (JP)

(73) Assignee: Kokusan Denki Co., Ltd.,
Shizuoka-ken (JP)

( * ) Notice: Subject to any disclaimer, the term of this patent is extended or adjusted under 35 U.S.C. 154(b) by 98 days.

(21) Appl. No.: 11/154,796

(22) Filed: Jun. 16, 2005

(65) Prior Publication Data

US 2005/0280422 A1   Dec. 22, 2005

(30) Foreign Application Priority Data

Jun. 18, 2004 (JP) ............................. 2004-180653
Jul. 7, 2004 (JP) ............................. 2004-200796

(51) Int. Cl.
*G01R 31/08* (2006.01)
(52) U.S. Cl. ......................................... 324/522; 361/42
(58) Field of Classification Search ................. 324/522
See application file for complete search history.

(56) References Cited

U.S. PATENT DOCUMENTS 3,343,080 A * 9/1967 Fox ............................. 324/522

4,551,811 A * 11/1985 Taniguti ....................... 702/58

FOREIGN PATENT DOCUMENTS

JP           10-142282           5/1998
JP           2000-149758         5/2000

* cited by examiner

*Primary Examiner*—Vincent Q. Nguyen
(74) *Attorney, Agent, or Firm*—Pearne & Gordon LLP

(57) ABSTRACT

An electric leakage detection system having: a detection point forming circuit which forms a detection point being connected through three resistors which are star-connected to a three-phase output line of an AC generator; a voltage detection circuit which detects a voltage across the detection point and ground; and an electric leakage detecting part which detects existence of an electric leakage from a period of the detected voltage and determines an occurrence position of the electric leakage from a period of the detected voltage.

5 Claims, 11 Drawing Sheets

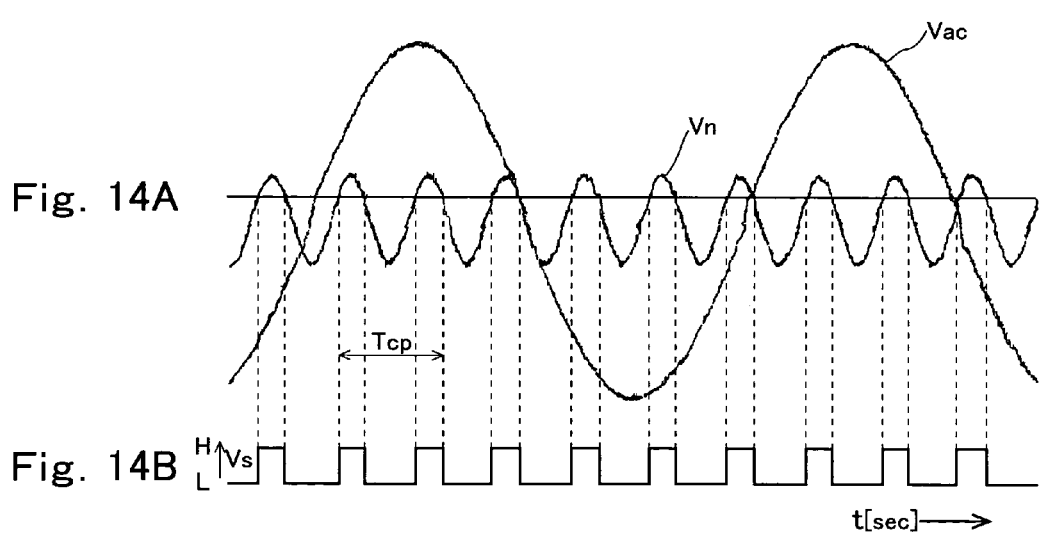

ELECTRIC LEAKAGE DETECTION SYSTEM

TECHNICAL FIELD OF THE INVENTION

The present invention relates to an electric leakage detection system which detects an electric leakage of a power source unit for supplying an electric power to a load, using an AC generator as a power source.

BACKGROUND OF THE INVENTION

As a device for detecting an electric leakage (ground fault) of a power source unit using an AC generator as a power source, there is proposed an electric leakage detection system wherein an electric leakage is detected by detecting a zero-phase current flowing through a ground line which connects a neutral point of armature coils of a three-phase AC generator to ground, as disclosed in Japanese Patent Application Laid-Open Publication Nos. 10-142282 and 2000-149758.

In such an electric leakage detection system for detecting an electric leakage from a zero-phase current flowing through a ground line which grounds a neutral point of a generator when the electric leakage occurs, it is necessary to lay around the long ground line which grounds the neutral point of the generator to a place of installation when it is required to install the electric leakage detection system apart from the generator, and thus complexity for distributing the ground line was a problem.

In addition, when there is not a neutral point among the armature coils of the AC generator, for example, a case where the armature coils are delta-connected or the generator is a single-phase AC generator, a proposal described above cannot be applied.

In order to take a required step when the electric leakage occurs, it is desirable to be able to determine a position where the electric leakage (ground fault) occurred in the power source unit. However, determination of a position of the electric leakage cannot be performed in a conventional electric leakage detection system.

SUMMARY OF THE INVENTION

Therefore, an object of the invention is to provide an electric leakage detection system that can be provided at a position apart from an AC generator without laying around a long ground line, and that can be applied even when the AC generator does not have a neutral point.

Another object of the invention is to provide an electric leakage detection system that can detect an occurrence of an electric leakage at a place apart from an AC generator without laying around a long wire being connected to a neutral point of the generator, and that can perform determination of a position of the electric leakage.

A further object of the invention is to provide an electric leakage detection system that can detect an occurrence of an electric leakage even when a generator does not have a neutral point, and that can perform determination of a position of the electric leakage.

The invention is applied to an electric leakage detection system which detects an electric leakage of a power source unit for providing an electric power to a load using an AC generator as a power source. It is satisfactory to comprise the AC generator as the power source in the power source unit applying the electric leakage detection system according to the invention, and a construction of the power source unit may be arbitral. A typical power source unit suitable for applying the electric leakage detection system of the present invention is a power source unit comprising a converter for converting an output of the AC generator into a DC voltage and an inverter for converting the DC voltage obtained from the converter into an AC voltage, a power source unit comprising an AC generator having a field coil so as to adjust an output voltage by controlling an exciting current, or the like; however, the power source unit applying the invention is not limited to these.

In the present invention, there are provided: a detection point forming circuit for forming a detection point which is connected to each output line of the AC generator through a high impedance element; a voltage detection circuit for detecting a voltage across the detection point and ground; and an electric leakage detecting part for detecting the electric leakage when the voltage detected by the voltage detection circuit become equal to or higher than a set determination value.

In a preferable embodiment of the invention, the above detection point forming circuit is constituted by three resistors having large resistance values, one end of each being connected to a three-phase output line of the AC generator, respectively, and the other end of each being commonly connected. A common connection point of three resistors is used as the detection point.

As aforementioned, when the detection point being connected to each output line of the AC generator through the high impedance element is provided to detect the voltage across the detection point and ground, the voltage across the detection point and ground becomes substantially zero level when no electric leakage occurs in the power source unit, and becomes equal to or higher than a threshold level when the electric leakage occurs. Therefore, it can be detected at the power source unit that no electric leakage occurs when the voltage detected across the detection point and ground is lowered than the determination value which is set at a appropriate value, and that the electric leakage occurs when the detected voltage is equal to or higher than the determination value.

With the construction described above, since the detection point forming circuit may be connected to the output line of the generator near the position of the electric leakage detection system without laying around the ground line which grounds the neutral point of the generator, the electric leakage of the power source unit can be detected at a position apart from the generator without distributing the long ground line. In addition, the electric leakage can be detected in the case where armature coils of the generator do not have a neutral point.

In the present invention, in the case of performing determination of an occurrence position of an electric leakage, there are provided: a detection point forming circuit for forming a detection point which is connected to each output line of an AC generator through a high impedance element; a voltage detection circuit for detecting a voltage across the detection point and ground; electric leakage detecting means for detecting that the electric leakage occurs when the voltage detected by the voltage detection circuit become equal to or higher than a reference voltage; and electric leakage occurrence position determination means for determining an occurrence position of the electric leakage from a waveform of the voltage across the detection point and ground.

In the case of providing the detection point as aforementioned above, a waveform of the voltage appearing across the detection point and ground when an electric leakage (ground fault) varies depending on occurrence positions of the electric leakage waveform. Thus, when the electric leakage occurs between the AC generator and an electric power converter, a voltage having a wave period corresponding to a wave period of an output voltage of the AC generator is appeared across the detection point and ground. Also, an AC voltage having a wave period corresponding to a wave period of an AC voltage output from the electric power converter is appeared across the detection point and ground.

Therefore, the electric leakage occurrence position determination means is constituted so as to determine the occurrence position of the electric leakage from a relationship among the period of the voltage across the detection point and ground and at least one of the period of the output voltage of the AC generator and the period of output voltage of the electric power converter.

Moreover, by judging whether the period of the voltage appeared across the detection point and ground when the electric leakage is detected corresponds to the period of the output voltage of the AC generator, or judging whether the period of the voltage appeared across the detection point and ground when the electric leakage is detected corresponds to the period of the AC voltage output from the electric power converter, it is possible to determine that the electric leakage occurs at a circuit between the generator and the electric power converter or occurs on an output side of the electric power converter.

BRIEF DESCRIPTION OF THE DRAWINGS

The above and other objects and features of the invention will be apparent from the detailed description of the preferred embodiments of the invention, which are described and illustrated with reference to the accompanying drawings, in which;

FIG. 14A is a waveform chart showing a waveform of a voltage obtained from the voltage detection circuit when the electric leakage occurs in a circuit between the AC generator of the power source unit and the electric power converter, and FIG. 14B is a waveform chart showing a waveform of the output voltage of the electric power converter in the embodiment shown in FIG. 9 and a waveform chart showing a waveform of an electric leakage detection pulse in the embodiment shown in FIG. 9.

DETAILED DESCRIPTION OF THE PREFERRED EMBODIMENTS

Preferred embodiments of the present invention will be described in further detail with reference to the accompanying drawings. In an embodiment shown in FIG. 1, there is used, as a power source unit for driving a load, an electric power converter 4 wherein an output of a three-phase AC generator is converted into a DC voltage by a converter, and then the DC voltage is converted into and an AC voltage having a constant frequency by an inverter so as to supply the AC voltage to the load.

Figure 1:
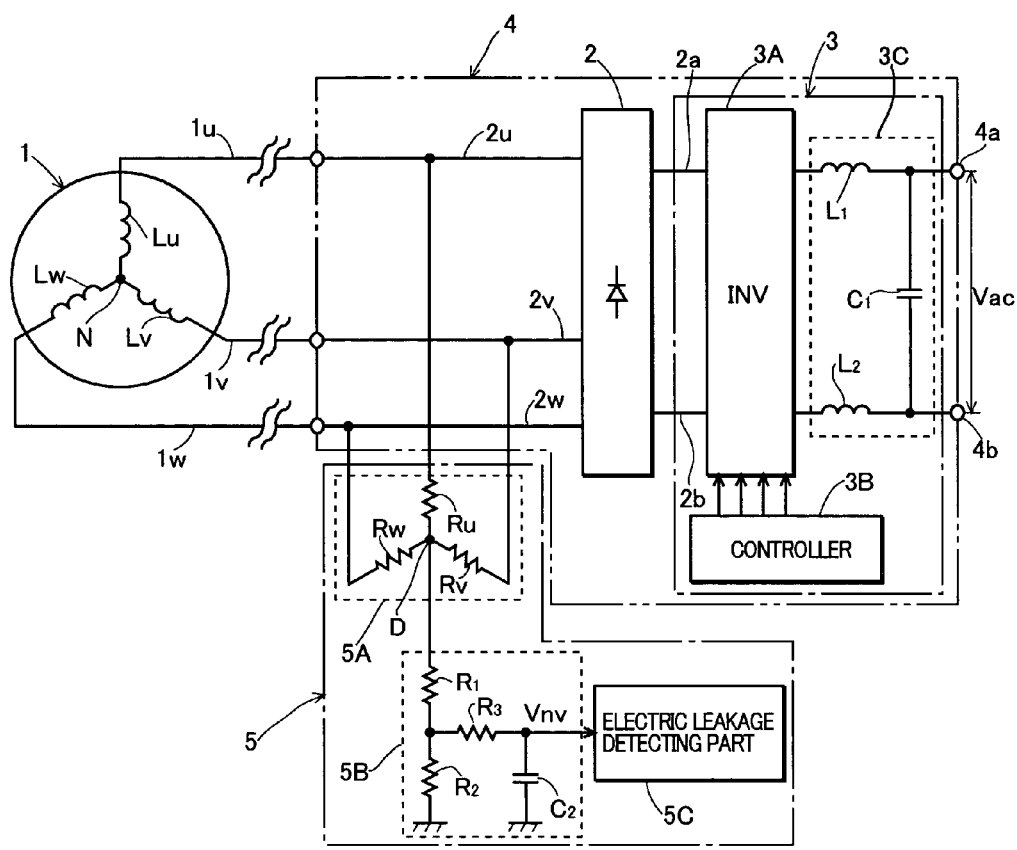
FIG. 1 is a circuit diagram showing a construction of an embodiment of the invention.

In FIG. 1, a reference numeral 1 denotes a three-phase AC generator driven by a prime mover such as an internal combustion engine, and the AC generator comprises three-phase armature coils Lu to Lw which are star-connected. Three-phase output lines 1u to 1w of the AC generator 1 are connected to three-phase input lines 2u to 2w of a converter 2 which is constituted by a full-wave rectifier circuit, and a voltage across DC output terminals 2a and 2b of the converter 2 is input to an inverter 3. The inverter 3 is a well-known type comprising: a full-bridge type inverter circuit (INV) 3A being consisted by an H-bridge circuit each side of a bridge being constituted by a switch element such as IGBT or MOSFET; a controller 3B for performing an on/off control of the switch element consisting the inverter circuit so that a AC voltage having a desired frequency is output from the inverter circuit 3A; and a filter circuit 3C for removing a high harmonic wave component from the AC voltage output from the inverter circuit 3A. In this embodiment, the electric power converter 4 is constituted by the converter 2 and the inverter 3, and the electric power converter 4 and the AC generator 1 constitutes a power source unit. The filter circuit 3C is constituted by a low-pass filter circuit which is consisted of coils L1, L2, a capacitor C1 and the like, and supplies an AC voltage Vac of a constant frequency, from which a high harmonic wave component is removed, to the load through load connection terminals 4a, 4b.

A reference numeral 5 denotes an electric leakage detection system according to the present invention, which comprises a detection point forming circuit 5A for forming a detection point D which is connected to the three-phase output lines 1u to 1w of the AC generator 1 through high impedance elements, respectively, a voltage detection circuit 5B for detecting a voltage across the detection point D and ground, and a electric leakage detecting part 5C for detecting that an electric leakage occurs when the voltage detected by the voltage detection circuit 5B becomes equal to or more than a set determination value.

The illustrated detection point forming circuit 5A is constituted by star-connected three resistors Ru to Rw, one end of each being electrically connected to the three-phase output lines 1u to 1w of the AC generator 1 and the other end of each being commonly connected. A common connection point of the three resistors Ru to Rw is used as the detection point D. When resistance values of the resistors Ru to Rw are equally set, a potential of the detection point D becomes substantially equal to a potential of a neutral point N of the armature coils Lu to Lw of the generator. Thus, the detection point D becomes a virtual neutral point of the power source unit. Therefore, although voltage to ground is substantially zero in the state where ground fault does not occur, a zero-phase voltage is appeared across the detection point and ground in the state where ground fault occurs. As a matter of course, the resistance values of the resistors Ru to Rw are set to be sufficiently large values so as not to generate substantial loss which may be a problem in the detection point forming circuit 5A.

The illustrated voltage detection circuit 5B comprises a resistance voltage dividing circuit being constituted by resistors R1 and R2 which are connected across the detection point D and ground in series, a resistor R3 one end of which being connected to a voltage dividing point of the resistance voltage dividing circuit, and a capacitor C2 which is connected across the other end of the resistor R3 and ground. The detection circuit 5B outputs, across both ends of the capacitor C2, a detection voltage Vnv proportional to the voltage across the detection point D and ground.

The electric leakage detecting part 5C is for detecting that the electric leakage occurs when the voltage across the detection point D detected by the voltage detection circuit 5B and ground is equal to or more than the set determination value. The electric leakage detecting part 5C is constituted of, for example, a reference voltage generation circuit for generating a constant reference voltage corresponding to the determination value, and a comparator for comparing the detection voltage Vnv with the reference voltage. A level of an output signal generated from the comparator when the detection voltage Vnv is lower than the reference voltage differs from that when the detection voltage Vnv is higher than the reference voltage. Also, the electric leakage detecting part 5C can be constituted so that existence of the electric leakage is detected by processing the output of the voltage detection circuit 5B using a microprocessor.

A detection output of the aforementioned electric leakage detecting part 5C can be used as an instruction signal for giving an instruction to stop a prime mover for driving the AC generator 1 when the electric leakage occurs or as a signal for driving alarm generating means when the electric leakage occurs.

Figure 6:
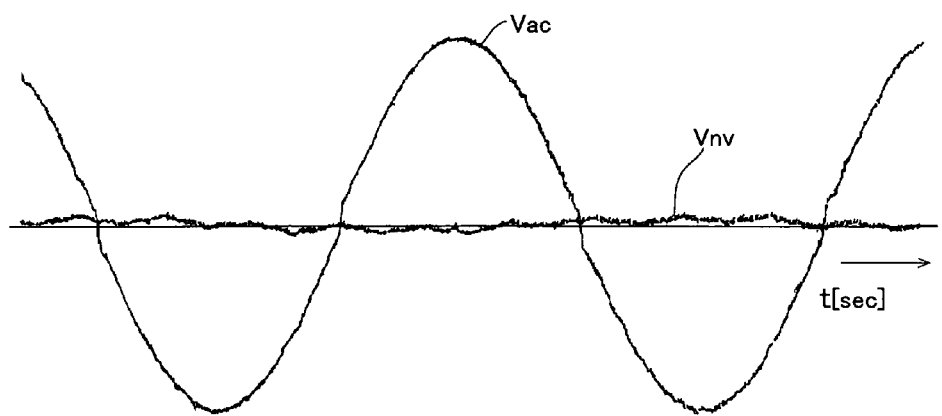
FIG. 6 is a waveform chart showing a voltage obtained from a voltage detection circuit when the electric leakage does not occur in the power source unit in the embodiment shown in FIG. 1.
Figure 7:
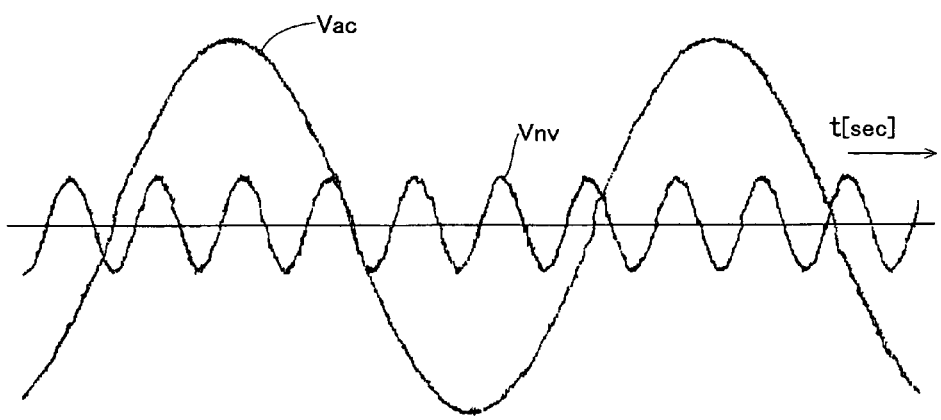
FIG. 7 is a waveform chart showing a voltage obtained from the voltage detection circuit when the electric leakage occurs in a circuit on the side of the AC generator of the power source unit in the embodiment shown in FIG. 1.
Figure 8:
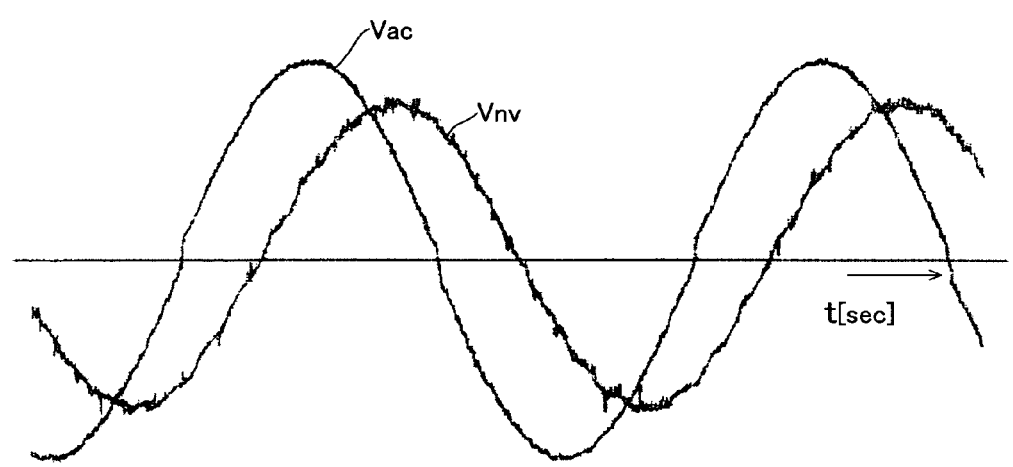
FIG. 8 is a waveform chart showing a voltage obtained from the voltage detection circuit when the electric leakage occurs on the output side of the electric power converter of the power source unit in the embodiment shown in FIG. 1.

In the embodiment shown in FIG. 1, there are shown, in FIG. 6 to FIG. 8, observation results of the detection voltage Vnv obtained from the voltage detection circuit 5 in the case where the electric leakage occurs in the power source unit and in the case where the electric leakage does not occur. In this example, a magnet generator having three-phase armature coils is used as the AC generator 1, and the output voltage of the inverter 3 is set at 100[V] and a frequency of the output voltage as 50[Hz]. The detection voltage Vnv, obtained from the voltage detection circuit 5B when the electric leakage does not occur in the power source unit, is maintained at substantially zero level as shown in FIG. 6. A reference character Vac indicates an output voltage of the inverter.

Figure 2:
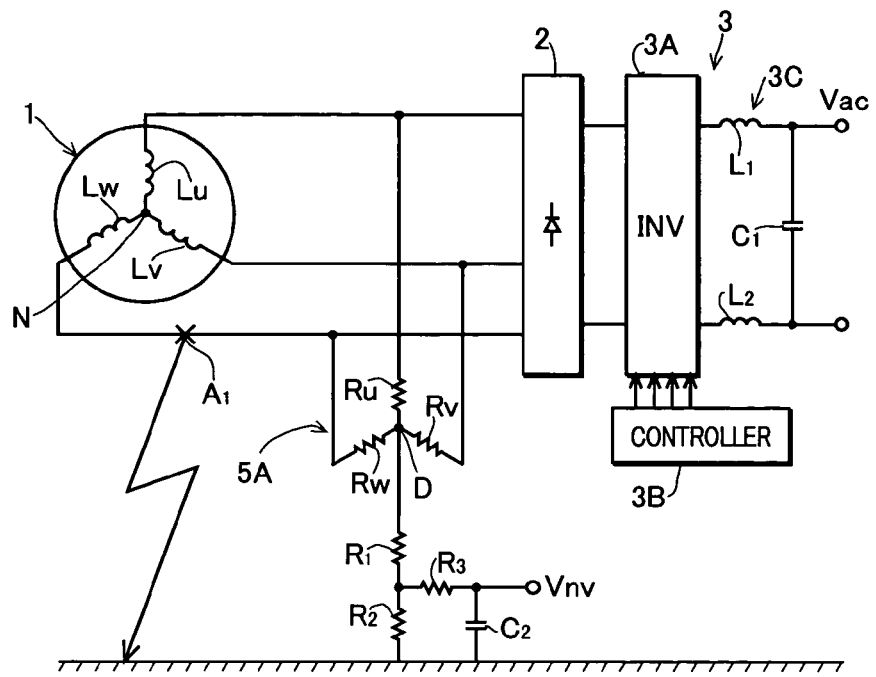
FIG. 2 is a circuit diagram showing a state where an electric leakage occurs on a side of an AC generator in the embodiment of FIG. 1.
Figure 3:
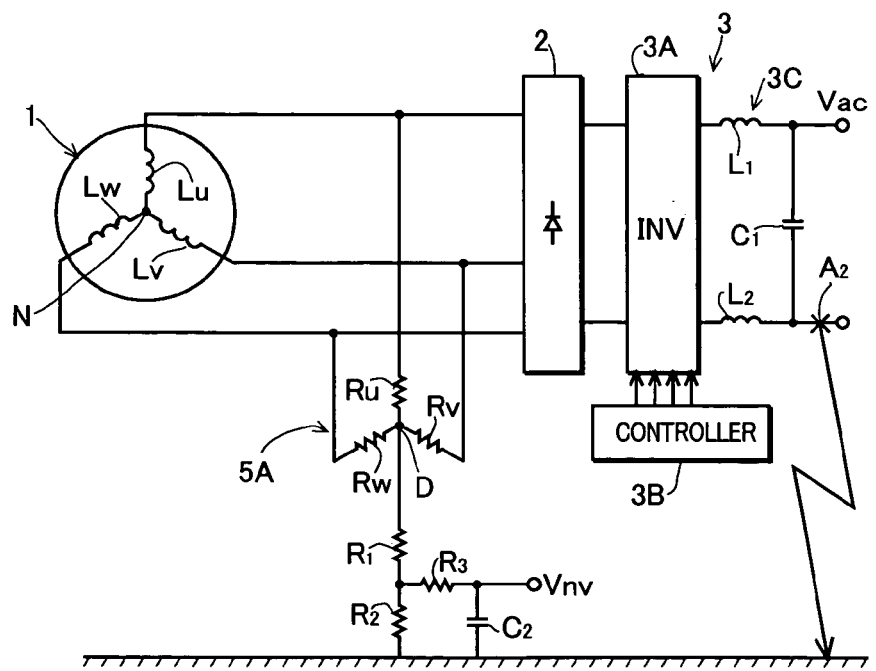
FIG. 3 is a circuit diagram showing a state where an electric leakage occurs on an output side of an electric power converter in the embodiment of FIG. 1.

On the other hand, when the electric leakage occurs at A1 on a single-phase output line of the AC generator as shown in FIG. 2, the detection voltage Vnv exhibits an AC waveform having a constant peak value and a frequency which is equal to a frequency of the output voltage of the AC generator as shown in FIG. 7. Also, as shown in FIG. 3, when the electric leakage occurs at A2 on an output side of the inverter, the detection voltage Vnv exhibits an AC waveform having a frequency equal to a frequency of the output voltage Vac of the inverter as shown in FIG. 8.

As stated above, since the voltage across the detection point D and ground is maintained at substantially zero level and indicates a large level when the electric leakage occurs in the power source unit, it can be detected whether the electric leakage occurs in the power source unit by determining whether the detection level of the voltage across the detection point and ground is equal to or more than the set determination value. Also, the frequency of the detection voltage Vnv when the ground fault occurs on the generator side differs from that when the ground fault occurs on the inverter side; therefore, it is possible to specify a position where the ground fault occurs by inspecting the frequency of the detection voltage Vnv.

In the above embodiment, although the resistance values of the resistors Ru to Rw consisting the detection point forming circuit 5A are equalized to make the voltage between the detection point D and ground be substantially equal to the voltage between the neutral point N of the AC generator and ground, the detection point D may be a point which is connected to each output line of the generator through a high impedance element and has electric potential different from any of electric potential of the output lines of the generator, and it may be unnecessary for the resistance values of the resistors Ru to Rw to be equal. When the resistance values of the resistors Ru to Rw are set to differ from each other, a zero-phase voltage appears across the detection point D and a ground circuit even when the ground fault does not occur. However, if the resistance values of the resistors Ru to Rw are appropriately set so that a degree of unbalance of the resistance values does not exceed a certain limit, it is possible to generate an obvious difference between the voltage across the detection point D and ground when the ground fault does not occur and the voltage across the detection point D and ground when the ground fault occurs, and thus can detect the existence of the ground fault (the electric leakage) without any trouble by setting a level (the determination value) of a reference voltage to be compared to the detection voltage Vnv in an appropriate manner.

In the illustrated example in FIG. 1, although the detection point forming circuit 5A is connected to the output line of the generator in the electric power converter 4, it may be connected to the output line of the generator outside of the electric power converter 4.

In the above embodiment, the armature coils of the AC generator 1 are star-connected; however, the detection of the electric leakage can be performed without any trouble also in the case where the neutral point is not included in the AC generator, that is, the case where the armature coils are delta-connected.

Figure 4:
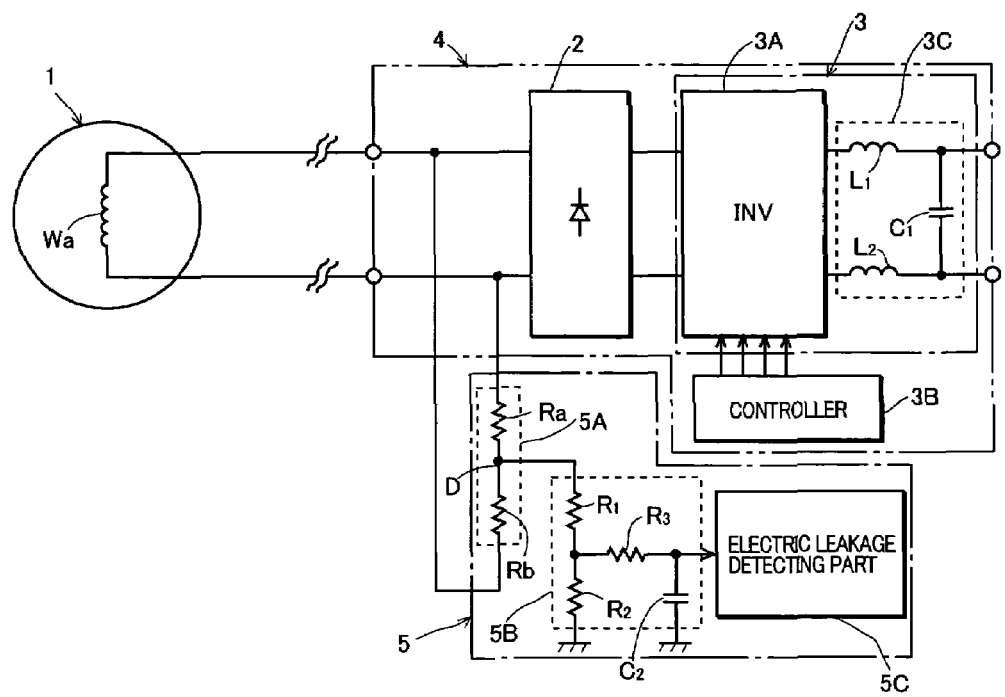
FIG. 4 is a circuit diagram showing an another embodiment of the invention.

In the above embodiment, although the three-phase AC generator is used as the AC generator 1, the present invention may be applied to a case where a single-phase AC generator having a single-phase armature coil Wa, both ends of which being in a non-grounded state, as the AC generator as shown in FIG. 4. When the single-phase AC generator is used as the AC generator 1, a resistance voltage dividing circuit comprising a series circuit of resistors Ra and Rb which resistance values are sufficiently large is connected between two output lines of the generator 1, and the detection point forming circuit 5A is constituted by the resistance voltage dividing circuit 5A. The voltage dividing point of the voltage dividing circuit is used as the detection point D. Another construction of the embodiment shown in FIG. 4 is the same as the embodiment shown in FIG. 1.

The resistance values of the resistors Ra and Rb may be equal to or different from each other also in the embodiment shown in FIG. 4. It is sufficient if the potential of the detection point D differs from any potential of the two output lines of the generator.

Figure 5:
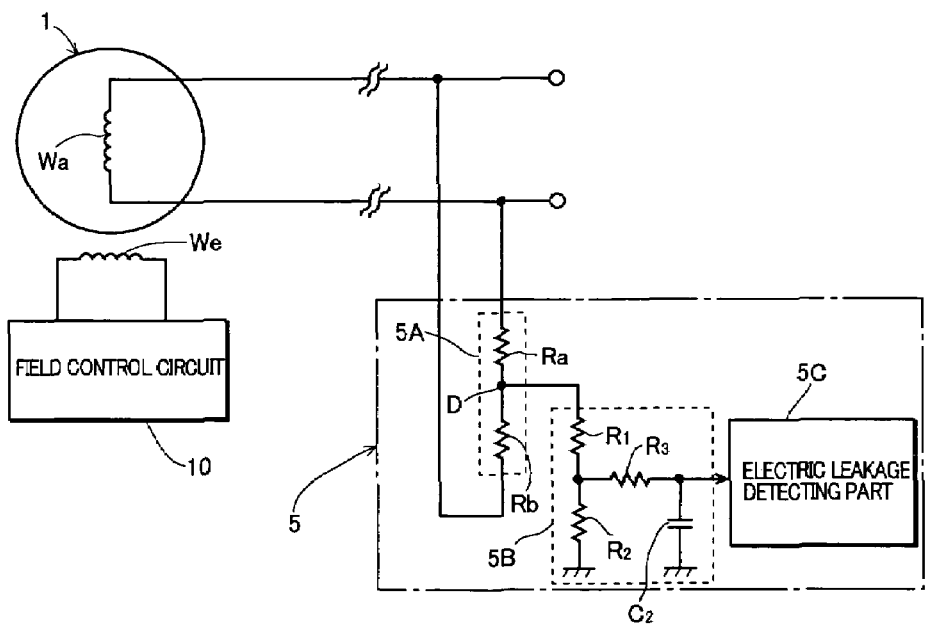
FIG. 5 is a circuit diagram showing a further embodiment of the invention.

Also, the power source unit applying the electric leakage detection system according to the invention is not limited to a power source unit which uses an inverter unit. For example, as shown in FIG. 5, the electric leakage detection system according to the present invention can be also applied to a case where the power source unit is constituted of an exciter-type AC generator 1 having an armature coil Wa and a field coil We which exciting current is controlled by a field control circuit 10. A construction of the electric leakage detection system 5 in this case is same as the example shown in FIG. 4.

In each embodiment described above, the detection point D is connected to each output line of the AC generator through the resistor, but the detection point may be a point which is connected to each output line of the AC generator through the high impedance element and has a potential different from any potential of the output lines of the generator, and at which the zero-phase voltage is appeared between the potential to ground and the point. Therefore, the high impedance element connecting across the detection point D and each output line of the generator is not limited to the resistor.

Hereinafter, it is described a preferred embodiment in the case where it is performed not only the detection of the electric leakage but also a determination of an occurrence position of the electric leakage.

Figure 9:
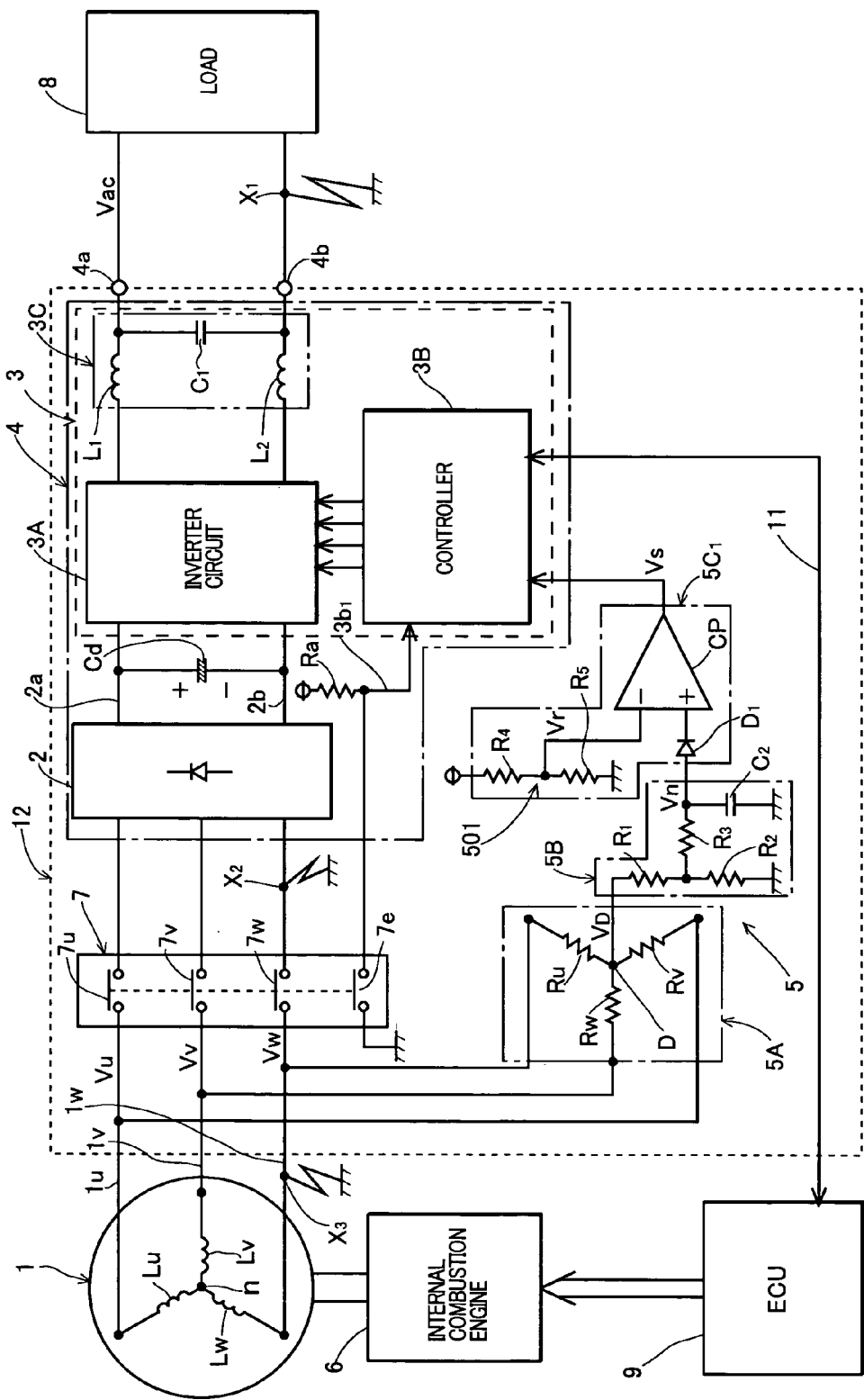
FIG. 9 is a circuit diagram showing a further another embodiment of the invention.

In the embodiment shown in FIG. 9, an AC generator comprises a three-phase AC generator 1 driven by an internal combustion engine 6 and a electric power converter 4 into which a three-phase AC output of the generator 1 is input through a three-phase mode switch 7. The internal combustion engine 6 serves as a prime mover which drives a driving wheel of a vehicle not shown. The electric power converter 4 is operated when a generating mode is selected (when the switch 7 is closed) to supply an electric power to a load 8 outside. When a driving mode is selected (when the switch 7 is opened), an operation of the electric power converter 4 is stopped to stop an output of the power source unit. Although the generator 1 is driven even when the vehicle is running, the output generated by the generator 1 when the vehicle is running is used for charging a battery, driving electric equipments necessary for operating the internal combustion engine, driving electric appliances such as headlights provided in the vehicle, and the like.

The three-phase AC generator 1 is constituted by, for example, a magneto AC generator having three-phase armature coils Lu to Lw on a stator side of the generator, and the three-phase armature coils Lu to Lw are star-connected. In the case of applying the electric leakage detection system according to the present invention, each phase of the armature coils of the generator is separated from the potential to ground. In the case of star-connecting the three-phase armature coils Lu to Lw, a neutral point of these are separated from a grounded circuit.

The electric converter 4 comprises a converter 2 for converting an AC voltage, which is input, into a DC voltage, a power source capacitor Cd connected across output terminals 2a and 2b of the converter 2, and an inverter 3 for converting a DC output of the converter 2 into an AC voltage having a constant frequency. The inverter 3 includes a known construction comprising an inverter circuit 3A, a controller 3B for controlling the inverter circuit 3A, and a filter 3C for removing a high harmonic wave component from an AC output of the inverter circuit 3A, and a load 8 is connected across output terminals 4a and 4b which are led out from the filter circuit 3C.

The converter 2 comprises, for example, a full-wave rectifier circuit being consisted of a bridge circuit of a diode and converts the AC output of the generator 1 into the DC output. Also, the inverter circuit 3A comprises a full-bridge type switch circuit in which each side of H-bridge is consisted of on/off controllable switch elements such as MOSFET, and the filter circuit 3C comprises a low-pass type filter circuit being consisted of coils L1 and L2 and a capacitor C1.

Output lines 1u to 1w output from end portions of the three-phase armature coils of the AC generator 1 in the opposite direction from the neutral point are connected to three-phase input terminals of the converter 2 through a mode switch 7. The mode switch 7 has three-phase contacts 7u, 7v, 7w and an earth contact 7e for a ground circuit. The three-phase output lines 1u to 1w are connected to the corresponding three-phase input terminals of the converter through the corresponding three-phase contacts of the mode switch, and a voltage across DC output terminals of the converter 2 is applied across DC input terminals of the inverter circuit 3A.

The controller 3B comprises a microprocessor and controls on/off the switch elements of the inverter circuit 3A so as to output an AC voltage of a constant frequency from the filter 3C. The controller 3B includes a command signal input terminal 3b1 into which a mode selecting command for selecting a vehicle driving mode or a generating mode as an operation mode of the engine is given. In the illustrated example, the command signal input terminal 3b1 is connected to an output terminal (not shown) on a positive pole side of a fixed voltage power source circuit through a resistor Ra, and is also connected to a ground circuit through the contact 7e for the ground circuit of the mode switch 7.

The mode switch 7 is operated manually or electrically, and the contacts 7u, 7v, 7w and 7e are turned on and off at the same phase. When the internal combustion engine is operated at the generating mode, the mode switch 7 is turned on, and when the engine is operated at the vehicle driving mode, the mode switch is turned off.

When the mode switch is turned on, a potential of the mode signal input terminal 3b1 of the controller 3B is set to be ground potential, and a generating mode selecting command is supplied to the controller 3B. When the mode switch 7 is turned off, the vehicle driving mode selecting command is given to the controller 3B by setting the potential of the mode signal input terminal 3b1 of the controller 3B to be a high level.

The controller 3B controls the switch elements of the inverter circuit 3A so as to generate an AC output having a constant frequency from the electric power converter 4 when the generating mode selecting command is given and stops a control of the switch elements of the inverter circuit 3A when the vehicle driving mode selecting command is given, in order to stop the output of the AC voltage from the electric power converter 4. Also, when an occurrence of the electric leakage is detected by an electric leakage detection system which is described later, the controller 3B constitutes electric leakage occurrence position determination means which determines an occurrence position of the electric leakage.

Although it is not shown, there is provided an AC output detection circuit for detecting a voltage across output terminals 4a and 4b of the electric converter 4. A detection output of the AC output detection circuit is input to the controller 3B. The microprocessor provided in the controller 3B regularly operates, as a target rotational speed, a rotational speed of the internal combustion engine required for maintaining the output voltage of the electric power converter detected by the AC output detection circuit at a set value, when the generating mode selecting command is given.

A reference numeral 9 denotes an electronic control unit (ECU) for controlling the internal combustion engine 6, which is connected to the controller 3B of the electric power converter 4 by a communication line 11. The controller 3B and the ECU 9 comprise communication means for performing a serial communication therebetween. A content of the mode selecting command being supplied to the controller 3B, an information of the target rotational speed of the engine which is arithmetically operated by the microprocessor of the controller 3B when the generating mode is selected and an information of the electric leakage occurrence position determined by the electric leakage occurrence position determination means are supplied to the ECU 9 through the communication line 11.

In addition to the control of the ignition timing of the internal combustion engine and the control of the fuel injection system for supplying fuel to the internal combustion engine, the ECU 9 performs a control of the rotational speed of the engine 1 so that the rotational speed of the internal combustion engine 6 is maintained at the target rotational speed arithmetically operated by the controller 3B.

Figure 10:
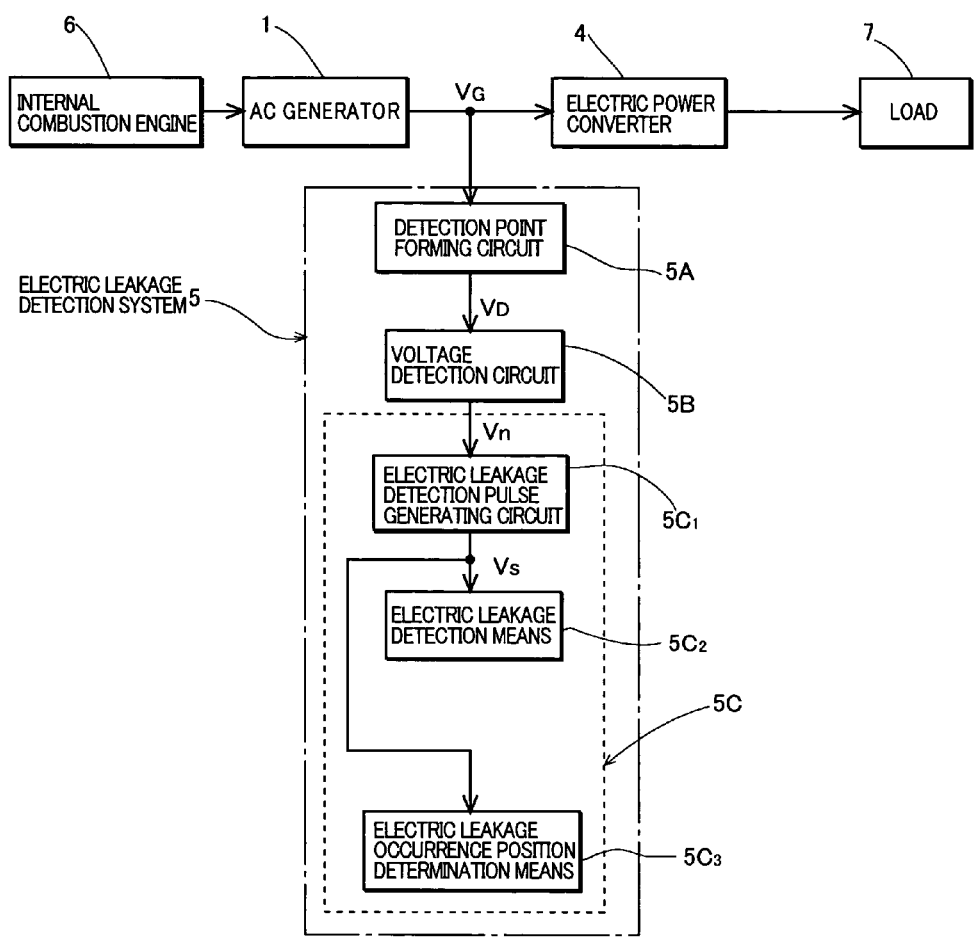
FIG. 10 is a block diagram showing a construction of a main part of the embodiment shown in FIG. 9.

A reference numeral 5 denotes an electric leakage detection system according to the present invention. In the electric leakage detection system, as shown in FIG. 10, there are provided: a detection point forming circuit 5A for forming a detection point D which is connected to each output line 1u to 1w of an AC generator 1 through a high impedance element; a voltage detection circuit 5B for detecting a voltage across the detection point D and ground; an electric leakage detection pulse generating circuit 5C1 for generating an electric leakage detecting pulse Vs which shows different level between when a voltage Vn detected by the voltage detection circuit 5B is less than a set reference voltage and when it is equal to or more than the set reference voltage; electric leakage detection means 5C2 for detecting that the electric leakage occurs in the AC power source unit when it is detected from the electric leakage detection pulse Vs that the voltage Vn is equal to or more than the reference voltage; and electric leakage occurrence position determination means 5C3 for determining an occurrence position of the electric leakage from a period of the electric leakage detection pulse Vs. The electric leakage detection pulse generating circuit 5C1, the electric leakage detection means 5C2 and the electric leakage occurrence position determination means 5C3 constitute an electric leakage detecting part 5C.

As same as the embodiment shown in FIG. 1, a detection point forming circuit 5A shown in FIG. 9 is constituted by star-connected three resistors Ru to Rw, one end of each being electrically connected to three-phase output lines 2u to 2w of the AC generator 1 and the other end of each being commonly connected. A common connection point of the three resistors Ru to Rw is used as the detection point D.

An illustrated voltage detection circuit 5B comprises a resistance voltage dividing circuit being constituted by resistors R1 and R2 which are connected across the detection point D and ground in series, a resistor R3 one end of which being connected to a voltage dividing point of the resistance voltage dividing circuit, and a capacitor C2 which is connected across the other end of the resistor R3 and ground as same as the embodiment shown in FIG. 1. The voltage detection circuit outputs, across both ends of the capacitor C2, a detection voltage Vn proportional to the voltage across the detection point D and ground.

An electric leakage detection pulse generating circuit 5C1 is a circuit for generating an electric leakage detection pulse Vs showing a different level between when the voltage Vn detected by the voltage detection circuit 5B is less than a set reference voltage and when it is equal to or more than the set reference voltage. The electric leakage detection pulse generating circuit 5C1 comprises a reference voltage generation circuit 501 for generating a constant reference voltage Vr corresponding to a determination value, and a comparator CP for comparing a detection voltage Vn with a reference voltage Vr to generate an output signal. The level of the output signal generated from the circuit 5C1 when the detection voltage Vn is lower than the reference voltage Vr differs from that when the detection voltage Vn is higher than the reference voltage Vr.

The illustrated reference voltage generation circuit 501 is constituted of a voltage dividing circuit for dividing an output voltage of a constant voltage power source circuit (not shown) by resistors R4 and R5, and a reference voltage Vr obtained from the reference voltage generating circuit 5B is input to a reverse input terminal of a comparator CP. Also, an output voltage of the voltage detection circuit 5B is input to a non-reverse input terminal of the comparator CP through a diode D1. The comparator CP outputs an electric leakage detection pulse Vs being on a low level, (L level) when the detection voltage Vn is less than the reference voltage Vr and being on a high level (H level) when the detection voltage Vn is equal to or more than the reference voltage Vr. The electric leakage detection pulse Vs being output by the comparator CP is supplied to the microprocessor of the controller 3B.

The microprocessor of the controller 3B detects, from a change of the level of the electric leakage detection pulse Vs, that the electric leakage occurs in the power source system when the detection voltage Vn becomes equal to or higher than the reference voltage Vr. This determination process constitutes the electric leakage detection means 5C2 (refer to FIG. 10). The microprocessor also performs a process for determining, from a period of the electric leakage detection pulse Vs, whether the electric leakage occurs in a circuit between the AC generator 1 and the electric power converter 4 or whether it occurs in a circuit on an output side of the electric power converter 4. This determination process constitutes the electric leakage occurrence position determination means 5C3.

In the illustrated example, the mode switch 7, components of the electric power converter 4 and components of the electric leakage detection system 5 are housed in a common case and are forming a unit as an electric converter unit 12.

Figure 12A:
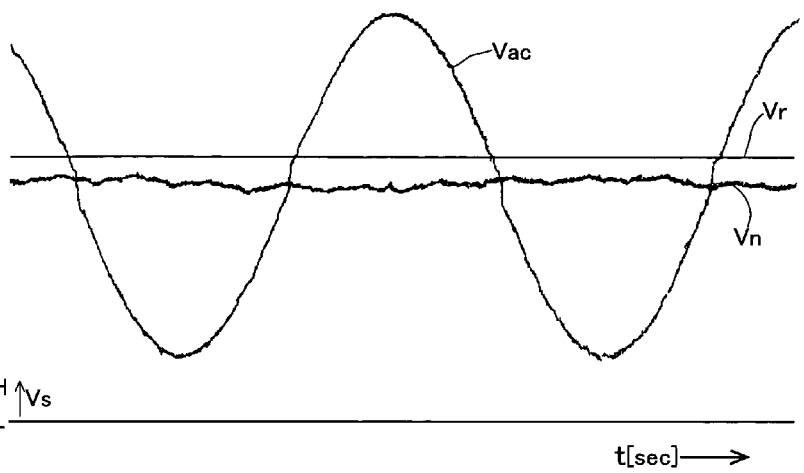
FIG. 12 is a waveform chart showing a waveform of a voltage obtained from the voltage detection circuit when the electric leakage does not occur in the power source unit, a waveform of the output voltage of the electric power converter and a waveform of an output of electric leakage detection means in the embodiment shown in FIG. 9.
Figure 12B:

In the embodiment shown in FIG. 9, there are shown in FIGS. 12 to 14 observation results of the detection voltage Vn obtained from the voltage detection circuit 5B in the case where the ground fault occurs and the case where the ground fault does not occur, using a magneto generator having three-phase armature coils as the AC generator 1 and setting the output voltage of the electric power converter 4 at 100[V] and the frequency at 50[Hz]. The detection voltage Vn obtained from the voltage detection circuit 5B when the ground fault does not occur in the power source unit maintains substantially a zero level as shown in FIG. 12A. At this state, since the detection voltage Vn cannot reach the reference voltage Vr, the output of the comparator CP maintains a low level (L level) as shown in FIG. 12B. In FIG. 12A, a character Vac denotes the output voltage of the electric power converter 4.

Figure 13A:
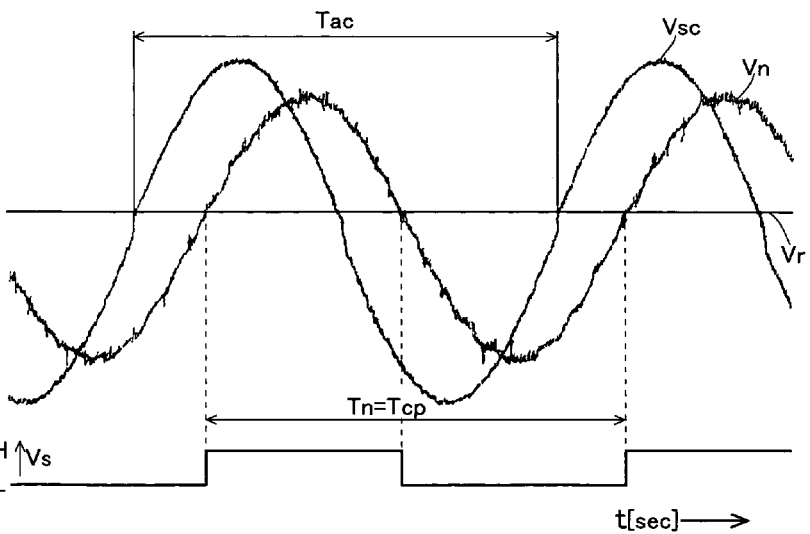
FIG. 13A is a waveform chart showing a waveform of a voltage obtained from the voltage detection circuit when the electric leakage occurs on the output side of the electric power converter and a waveform of the output voltage of the electric power converter in the embodiment shown in FIG. 9.
Figure 13B:
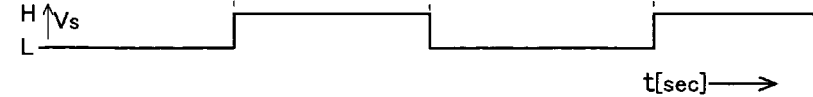
FIG. 13B is a waveform chart showing a waveform of an electric leakage detection pulse in the embodiment shown in FIG. 9.

On the other hand, when the ground fault occurs only at X1 of the circuit on the output side of the electric power converter 4 of FIG. 9, the detection voltage Vn shows an AC waveform having a frequency equal to a frequency of the output voltage Vac of the electric power converter 4, and a period Tn of the detection voltage Vn corresponds to a period Tac of the output voltage Vac of the electric power converter 4 as shown in FIG. 13A. At this state, sine the detection voltage Vn exceeds the reference voltage Vr, the comparator CP generates the electric leakage detection pulse Vs at which a level when the detection voltage Vn exceeds the reference voltage Vr is different from a level when the detection voltage Vn is equal to or less than the reference voltage Vr. In this embodiment, as shown in FIG. 13B, the comparator CP is provided so that the electric leakage detection pulse Vs becomes a high level (H level) when the detection voltage Vn exceeds the reference voltage Vr and that the electric leakage detection pulse Vs becomes a low level (L level) when the detection voltage Vn is equal to or less than the reference voltage Vr.

In this embodiment, a level of the reference voltage Vr is set so that the electric leakage detection pulse Vs is generated in any cases, the case where the electric leakage occurs on the output side of the electric power converter 4 or the case where the electric leakage in the circuit between the AC generator 1 and the electric power converter 4.

In the power source unit shown in FIG. 9, when the ground fault occurs at X2 located on a downstream (an electric power converter side) of the mode switch 7 of the circuit between the AC generator 1 and the electric power converter 4 or at X3 located on an upstream (a generator side) of the mode switch 7, the detection voltage Vn obtained from the voltage detection circuit 5B shows an AC waveform having a frequency equal to a frequency of the output voltage of the AC generator 1 as shown in FIG. 14A. A peak value of the detection voltage Vn increases following to an increase of the output voltage of the AC generator 1.

Also, in this case, since a period when the detection voltage Vn exceeds the reference voltage Vr is appeared, the comparator CP outputs the electric leakage detection pulse Vs, and the level of which becomes low when the detection voltage Vn is less than the reference voltage Vr and becomes high when the detection voltage Vn is equal to or higher than the reference voltage Vr.

As described above, the voltage VD across the detection point D and ground maintains substantially zero level when the ground fault does not occur in the power source unit and becomes high level when the ground fault occurs in the power source unit; thus, it is possible to detect whether or not the electric leakage occurs in the power source unit by detecting the voltage Vd across the detection point D and ground and determining whether the detection voltage Vn is equal to or higher than the set reference voltage Vr.

As illustrated, when the electric leakage detection pulse Vs, the level of which becomes low when the detection voltage Vn is less than the reference voltage Vr and becomes high when the detection voltage Vn is equal to or higher than the reference voltage Vr, is generated from the electric leakage detection pulse generating circuit 5C1, it can be detected that the electric leakage occurs in the power source unit when the microprocessor of the controller 3B detects that the electric leakage detection pulse Vs becomes high level, and thus the electric leakage detection means 5C2 (refer to FIG. 10) can be constituted by a process for determining the level of the electric leakage detection pulse to determine whether the electric leakage occurs.

Also, in this embodiment, the electric leakage occurrence position determination means 5E is constituted so that the electric leakage position is determined by allowing the microprocessor of the controller 4D to perform a process for determining whether it can be considered that a period of the electric leakage detection pulse Vs corresponds to the a period of the output voltage of the electric power converter 4. Thus, the determination of the electric leakage position is performed by comparing the period of the electric leakage detection pulse with the period of the output voltage of the electric power converter 4.

The determination, whether it can be considered that the period of the electric leakage detection pulse Vs corresponds to the period of the output voltage of the electric power converter 4, can be performed by determining whether a deviation between a detection value of the period of the electric leakage detection pulse and the period of the output voltage of the electric power converter is zero or is in a set error range. The detection of the period of the electric leakage detection pulse can be performed by counting a time from each rise of the electric leakage pulse to each next rise by a timer.

In the case of performing the determination of the electric leakage position by comparing the period of the electric leakage detection pulse Vs with the period of the output voltage of the electric power converter 4, the electric leakage occurrence position determination means 5C3 can be constituted so as to determine that the electric leakage occurs on the output side of the electric power converter 4 when it is considered that the period of the electric leakage detection pulse Vs corresponds to the period of the output voltage of the electric power converter 4, and determine that the electric leakage occurs in the circuit between the AC generator 1 and the electric power converter 4 when it is considered that the period of the electric leakage detection pulse Vs does not correspond to the period of the output voltage of the electric power converter 4.

In the case of detecting the existence of the electric leakage in the circuit between the AC generator and the electric power converter and the existence of the electric leakage on the output side of the electric power converter, it is not necessary to perform both the determination process of the existence of the electric leakage in the circuit between the AC generator and the electric power converter and the determination process of the existence of the electric leakage on the output side of the electric power converter. By performing any one of the determination process, it is possible to obtain a result of the other determination process. Also, it is not required to perform both the detection of the electric leakage being occurred at a specific position and the detection of the nonexistence of the electric leakage, and only one of these may be performed.

Therefore, the electric leakage occurrence position determination means 5C3 can be constituted so that it is determined that the electric leakage occurs in the circuit on the output side of the electric power converter 4 when it is considered that the period of the electric leakage detection pulse Vs corresponds to the period of the output voltage Vac of the electric power converter 4, for example.

Also, the electric leakage occurrence position determination means 5C3 can be constituted so that it is determined that the electric leakage occurs in the circuit between the AC generator 1 and the electric power converter 4 when the period of the electric leakage detection pulse Vs does not correspond to the period of the output voltage Vac of the electric power converter 4.

Moreover, the electric leakage occurrence position determination means 5C3 can be constituted so that it is determined that the electric leakage occurs in the circuit between the AC generator 1 and the electric power converter 4 when it can be considered that the period of the electric leakage detection pulse Vs corresponds to the period of the output voltage of the AC generator and so that it is determined that the electric leakage occurs on the output side of the electric power converter when it can be considered that the period of the electric leakage detection pulse Vs does not correspond to the period of the output voltage of the AC generator. The determination whether or not it can be considered that the period of the electric leakage detection pulse corresponds to the period of the output voltage of the AC generator can be performed by determining whether a deviation between the detection value of the electric leakage detection pulse and the detection value (which varies depending on the rotational speed of the generator) of the period of the output voltage of the AC generator is zero or is within a set error range. The detection of the period of the output voltage of the AC generator is performed, for example, by converting the detection waveform of the output voltage of the AC generator into a rectangular waveform, and then, by counting a time from each rise to each next rise of the rectangular waveform or a time from each fall to each next fall of the rectangular waveform by a timer.

The period of the output voltage of the AC generator can be arithmetically operated from the rotational speed of the internal combustion engine. In other words, the period of the output voltage of the AC generator can be obtained by dividing the rotational speed N [rpm] of the internal combustion engine by a number of magnetic poles p of the AC generator 1. When the internal combustion engine is controlled using the microprocessor, means for detecting the rotational speed of the internal combustion engine is generally provided. Thus, if the period of the output voltage of the generator is obtained by the above-described arithmetical operation, it is not required to provide a special detection circuit or a timer for obtaining the period, which allows the detection of the period of the output voltage of the generator to be performed easily.

Also, the electric leakage occurrence position determination means 5C3 can be constituted so that it is determined that the electric leakage occurs in the circuit between the AC generator and the electric power converter when the period of the electric leakage detection pulse corresponds to the period of the output voltage of the AC generator.

In addition, the electric leakage occurrence position determination means 5C3 can be constituted so that it is determined that the electric leakage occurs on the output side of the electric power converter when the period of the electric leakage detection pulse does not correspond to the period of the output voltage of the AC generator.

The determination whether the period of the electric leakage detection pulse Vs corresponds to the period of the output voltage of the AC generator 1 is performed by obtaining an information of the rotational speed of the internal combustion engine from the ECU 9 to determine whether the period of the electric leakage detection pulse Vs corresponds to a value (=N/p) which is obtained by dividing the rotational speed N [rpm] of the internal combustion engine by the number of magnetic poles p of the AC generator 1. Thus, when the period Tcp of the electric leakage detection pulse corresponds to N/p, it can be determined that the period of the electric leakage detection pulse corresponds to the period of the output voltage of the AC generator 1, and when the period Tcp of the electric leakage detection pulse does not correspond to N/p, it can be determined that the period of the electric leakage detection pulse does not correspond to the period of the output voltage of the AC generator 1.

Figure 11:
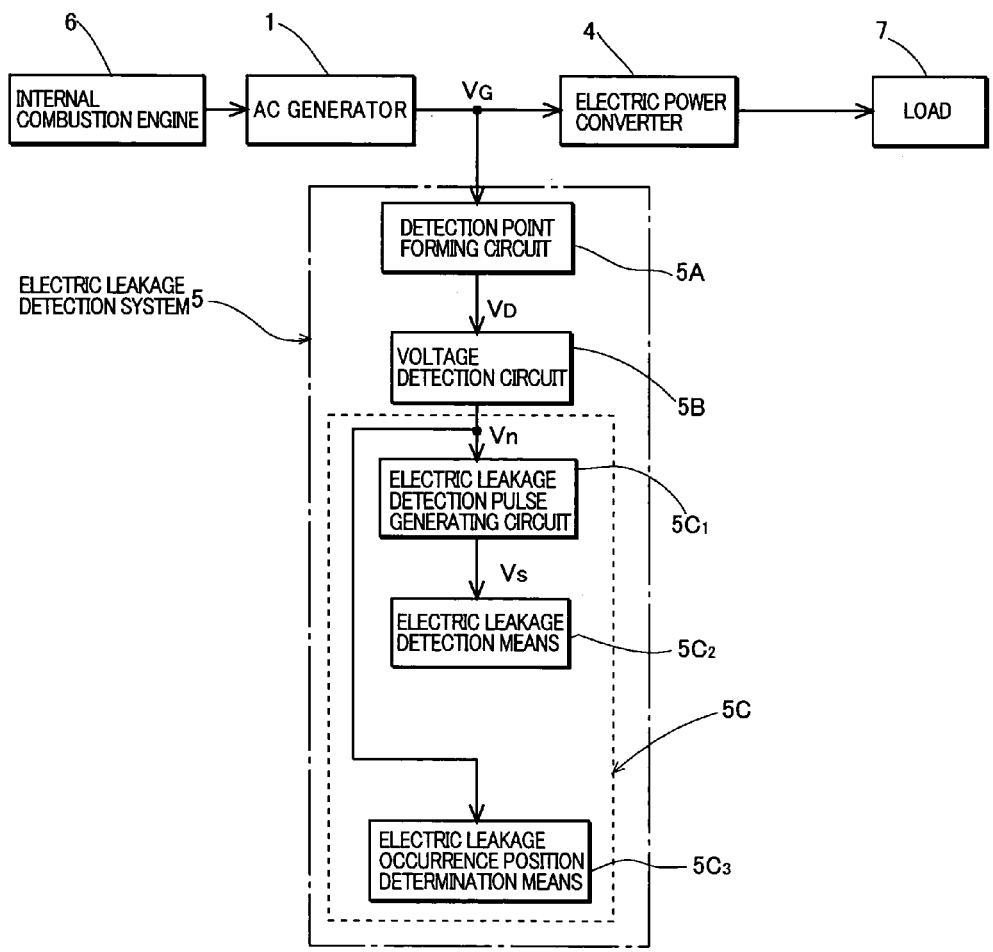
FIG. 11 is a block diagram showing a construction of a main part of a further embodiment of the invention.

Although it is so arranged that the electric leakage position is determined from the period of the electric leakage detection pulse Vs in the embodiment shown in FIG. 9, the determination of the electric leakage position may be performed by a period of the voltage between the detection point D and ground in the present invention. Therefore, as shown in FIG. 11, the determination of the electric leakage position may be performed by processing a waveform of a voltage detection signal Vn obtained from the voltage detection circuit 5B by the microprocessor to determine whether a period of the voltage detection signal Vn corresponds to the period of the output voltage of the AC generator or determine whether the period of the voltage detection signal Vn corresponds to the period of the output of the electric power converter.

If the ground fault occurs in the circuit on the output side of the electric power converter 4, the period of the voltage between the detection point D and ground (the period of the detection voltage Vn) corresponds to the period of the output voltage Vac of the electric power converter 4 as shown in FIG. 13. If the ground fault occurs in the circuit between the AC generator 1 and the electric power converter 4, the period of the voltage between the detection point D and ground (the period of the detection voltage Vn) corresponds to the period of the output voltage of the AC generator 1 as shown in FIG. 4. Thus, by determining whether the period of the detection voltage Vn corresponds to the period of the output voltage of the electric power converter 4 or by determining whether the period of the detection voltage Vn corresponds to the period of the output voltage of the AC generator, it is possible to determine that the electric leakage occurs in the circuit on the output side of the electric power converter 4 or in the circuit between the AC generator and the electric power converter.

In this case, the electric leakage occurrence position determination means 5C3 can be constituted so as to determine that the electric leakage occurs in the circuit between the AC generator 1 and the electric power converter 4 when the period of the voltage VD between the detection point D and ground corresponds to the period of the output voltage of the AC generator 1, and determine that the electric leakage occurs on the output side of the electric power converter 4 when the period of the voltage VD between the detection point D and ground does not correspond to the period of the output voltage of the AC generator 1.

If the occurrence of the electric leakage may be detected in the circuit between the AC generator and the electric power converter 4, the electric leakage occurrence position determination means 5C3 can be constituted so as to determine that the electric leakage occurs in the circuit between the AC generator 1 and the electric power converter 4 when the period of the voltage VD between the detection point D and ground corresponds to the period of the output voltage VG of the AC generator 1.

If the occurrence of the electric leakage may be detected in the circuit on the output side of the electric power converter 4, the electric leakage occurrence position determination means 5E can be constituted so as to determine that the electric leakage occurs in the circuit on the output side of the electric power converter 4 when the period of the voltage VD between the detection point D and ground does not correspond to the period of the output voltage VG of the AC generator 1.

Moreover, the electric leakage occurrence position determination means 5C3 can be constituted so as to determine that the electric leakage occurs in the circuit on the output side of the electric power converter 4 when the period of the voltage between the detection point D and ground corresponds to the period of the output voltage of the electric power converter 4, and determine that the electric leakage occurs in the circuit between the AC generator and the electric power converter 4 when the period of the voltage between the detection point D and ground does not correspond to the period of the output voltage of the electric power converter 4.

As aforementioned, if only existence of the electric leakage on the output side of the electric power converter may be determined when the electric leakage position is determined by determining whether the period of the voltage between the detection point D and ground corresponds to the period of the output voltage of the electric power converter 4, the electric leakage occurrence position determination means 5C3 can be constituted so as to determine that the electric leakage occurs in the circuit on the output side of the electric power converter 4 when the period of the voltage VD between the detection point D and ground corresponds to the period of the output voltage of the electric power converter 4.

Also, if the existence of the electric leakage may be determined in the circuit between the AC generator and the electric power converter, the electric leakage occurrence position determination means 5C3 can be constituted so as to determine that the electric leakage occurs in the circuit between the AC generator 1 and the electric power converter 4 when the period of the voltage VD between the detection point D and ground does not corresponds to the period of the output voltage of the electric power converter 4.

Moreover, as shown in FIG. 9, if the switch 7 is inserted between the AC generator and the electric power converter 4, the electric leakage occurrence position determination means 5C3 can be constituted so as to determine that the electric leakage occurs on the side of the generator 1 as viewed from the switch 7 when the electric leakage detection means 5C2 detects the occurrence of the electric leakage while the switch 7 is opened.

In the above embodiment, the resistance values of the resistors Ru to Rw for constituting the detection point forming circuit 5A are set to be equal in order to allow the potential of the detection point D to ground to be substantially equal to the potential of the neutral point N of the AC generator to ground; however, the detection point D may be a point which is connected to each output line of the generator through the high impedance elements and has a potential different from any potential of each output line of the generator, and the resistance values of the resistors Ru to Rw may not be necessarily equal. A difference between a potential of a neutral point n of the armature coils and a potential of the detection point D will arises if the resistance values of the resistors Ru to Rw vary. On the other hand, if the armature coils of the AC generator is provided in the non-grounded state, the detection is performed without any trouble since a voltage merely appear between the detection point D and ground when the electric leakage does not occur, and a high voltage appears between the detection point D and ground when the electric leakage occurs.

In the example shown in FIG. 9, the detection point forming circuit 5A is connected to the output line of the generator in an electric converter unit 12, but it may be connected to the output line of the generator outside the electric converter unit 12.

In the above embodiment, the armature coils of the AC generator 1 is star-connected; however, if the AC generator does not have the neutral point, that is, if the armature coils are delta-connected, the detection of the electric leakage position can be performed without any trouble.

Figure 15:
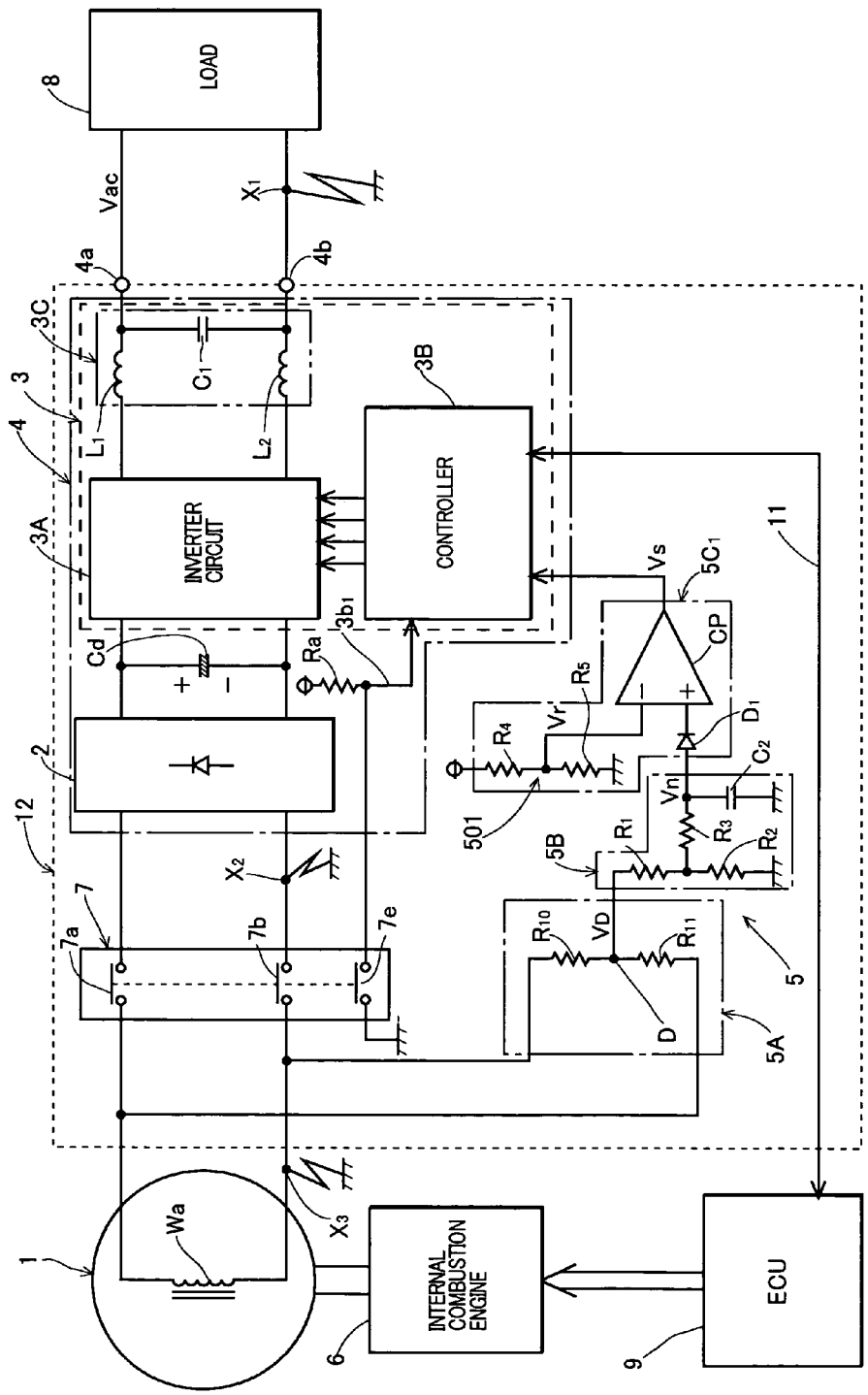
FIG. 15 is a circuit diagram showing a further another embodiment of the invention.

In the above embodiment, although the three-phase AC generator is used as the AC generator 1, the present invention can be applied to a case where a single-phase AC generator having a single-phase armature coil Wa, both ends of which is in the non-grounded state, as the AC generator 1 as shown in FIG. 15. When the single-phase AC generator is used as the AC generator 1, a resistance voltage dividing circuit being consisted of a series circuit of resistors R10 and R11 having sufficiently large resistance value is connected between two output lines of the generator 1, the detection point forming circuit 5A is constituted of the resistance voltage dividing circuit, and a voltage dividing point of the resistance voltage dividing circuit is set as the detection point D. An output of the armature coil Wa is input to the electric power converter 4 through contacts 7a and 7b of a mode switch 7. In this embodiment, the converter 2 of the electric power converter 4 is constituted of a single-phase bridge full-wave rectifier circuit. Another construction of the embodiment shown in FIG. 15 is in the same manner as the construction of the embodiment shown in FIG. 9.

Also, in the embodiment shown in FIG. 15, the resistance values of the resistors R10 and R11 may be equal or different, if the potential of the detection point D differs from any of the potentials of the two output lines of the generator.

In each embodiment described above, although the detection point D is connected to each output line of the AC generator through the resistors, the detection point D may be a point which is connected to each output line of the AC generator though the high impedance element and shows a potential different from any of potential of each output lines of the generator. Therefore, the high impedance element connecting the detection point D and ground is not limited to the resistor.

In the embodiment shown in FIG. 9, when the electric leakage (the ground fault) occurs in the electric power converter 4, a DC voltage appears between the detection point D and ground. When a positive-pole-side output terminal of the converter 2 is grounded, a voltage having negative polarity appears between the detection point D and ground. Thus, according to need, it is possible to determine whether the electric leakage occurs in the electric power converter 4, by comparing a level of the DC voltage with a reference voltage when the DC voltage appears between the detection value D and ground.

As aforementioned, according to the invention, since the detection point connected through the high impedance element is provided in each output line of the AC generator so as to detect the existence of the electric leakage from the voltage across the detection point and ground, the electric leakage of the power source unit can be detected at a position apart from the generator without laying around the ground line which grounds the neutral point of the generator. Also, in the present invention, the electric leakage can be detected in the case where the armature coils of the generator do not have the neutral point.

Further in the invention, when the detection point connected through the high impedance element is provided in each output line of the AC generator so as to detect the existence of the electric leakage from the voltage across the detection point and ground, the electric leakage of the power source unit can be detected at a position apart from the generator without laying around a long wire connecting to the neutral point of the generator.

Also, according to the present invention, the electric leakage can be detected in the case where the armature coils of the AC generator do not have the neutral point.

Furthermore, according to the invention, it can be determined from the waveform of the voltage appearing between the detection point and ground whether the electric leakage occurs between the generator and the electric power converter or occurs on the output side of the electric power converter; consequently, it is possible to specify the occurrence position of the electric leakage and perform appropriate steps for safety.

Although the preferred embodiments of the invention have been described and illustrated with reference to the accompanying drawings, it will be understood by those skilled in the art that these are by way of example, and that various changes and modifications may be made without departing from the spirit and scope of the invention, which is defined only to the appended claims.

What is claimed is:

1. An electric leakage detection system for detecting an electric leakage of a power source unit which supplies an electric power to a load using an AC generator as a power source,
   wherein said electric leakage detection system comprises:
   a detection point forming circuit which forms a detection point being connected to each output line of said AC generator through a high impedance element; a voltage detection circuit which detects a voltage across said detection point and ground; and an electric leakage detecting part which detects that the electric leakage occurs when the voltage detected by said voltage detection circuit becomes equal to or higher than a determination value,
   wherein said AC generator is a three-phase AC generator;
   wherein said detection point forming circuit is constituted by three resistors, one end of each being connected to a three-phase output line of the AC generator, respectively, and the other end of each being commonly connected; and wherein a common connection point of said three resistors is used as said detection point.

2. An electric leakage detection system of an AC power source unit comprising an AC generator and an electric power converter which converts an output of said AC generator into an AC output having a constant frequency to supply the AC output to a load,
   wherein said electric leakage detection system of the AC power source unit comprises: a detection point forming circuit which forms a detection point being connected to each output line of said AC generator through a high impedance element; a voltage detection circuit which detects a voltage across said detection point and ground; an electric leakage detection means which detects that the electric leakage occurs when the voltage detected by said voltage detection circuit becomes equal to or higher than a reference voltage; and electric leakage occurrence position determination means which determines an occurrence position of the electric leakage from a period of the voltage across the detection point and ground.

3. The electric leakage detection system according to claim 2, wherein said electric leakage occurrence position determination means is constituted so as to determine the occurrence position of the electric leakage from a relation among the period of the voltage across the detection point and ground and at least one of a period of an output voltage of said AC generator and a period of an output voltage of said electric power converter.

4. The electric leakage detection system according to claim 2, wherein said electric leakage occurrence position determination means is constituted so as to determine that the electric leakage occurs in a circuit between said AC generator and said electric power converter when the period of the voltage between the detection point and ground corresponds to a period of an output voltage of said AC generator, and determine that the electric leakage occurs in a circuit on an output side of said electric power converter when the period of the voltage between the detection point and ground does not correspond to the period of the output voltage of said AC generator.

5. The electric leakage detection system according to claim 2, wherein said electric leakage occurrence position determination means is constituted so as to determine that the electric leakage occurs in a circuit on an output side of said electric power converter when the period of the voltage between the detection point and ground corresponds to a period of an output voltage of said electric power converter, and determine that the electric leakage occurs in a circuit between the AC generator and the electric power converter when the period of the voltage between the detection point and ground does not correspond to the period of the output voltage of said electric power converter.

* * * * *